United States Patent
Matsudai et al.

(10) Patent No.: US 12,080,784 B2
(45) Date of Patent: Sep. 3, 2024

(54) SEMICONDUCTOR DEVICE AND METHOD OF CONTROLLING SAME

(71) Applicants: Kabushiki Kaisha Toshiba, Tokyo (JP); Toshiba Electronic Devices & Storage Corporation, Tokyo (JP)

(72) Inventors: Tomoko Matsudai, Shibuya Tokyo (JP); Yoko Iwakaji, Meguro Tokyo (JP); Takeshi Suwa, Kawasaki Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 18/101,712

(22) Filed: Jan. 26, 2023

(65) Prior Publication Data

US 2023/0170405 A1  Jun. 1, 2023

Related U.S. Application Data

(60) Continuation of application No. 17/383,837, filed on Jul. 23, 2021, now Pat. No. 11,594,622, which is a (Continued)

(30) Foreign Application Priority Data

Mar. 19, 2019 (JP) ................................. 2019-050702
Sep. 13, 2019 (JP) ................................. 2019-166842

(51) Int. Cl.
*H01L 29/739* (2006.01)
*H01L 23/522* (2006.01)
(Continued)

(52) U.S. Cl.
CPC ...... *H01L 29/7397* (2013.01); *H01L 23/5228* (2013.01); *H01L 29/4236* (2013.01);
(Continued)

(58) Field of Classification Search
CPC ............. H01L 29/7397; H01L 29/4236; H01L 29/66348; H01L 29/7393; H01L 29/7395; H01L 23/5228; H03K 17/60
See application file for complete search history.

(56) References Cited

U.S. PATENT DOCUMENTS

| | | |
|---|---|---|
| 5,298,769 A | 3/1994 | Omura et al. |
| 5,554,862 A | 9/1996 | Omura et al. |

(Continued)

FOREIGN PATENT DOCUMENTS

| | | |
|---|---|---|
| JP | 3257186 B2 | 2/2002 |
| JP | 3333299 B2 | 10/2002 |

(Continued)

*Primary Examiner* — Joseph C. Nicely
(74) *Attorney, Agent, or Firm* — Knobbe Martens Olson & Bear LLP

(57) ABSTRACT

A semiconductor device includes a semiconductor part having a first surface and a second surface opposite to the first surface, a first electrode on the first surface, a second electrode on the second surface, first to third control electrodes between the first electrode and the semiconductor part. The first to third control electrodes are biased independently from each other. The semiconductor part includes a first layer of a first-conductivity-type, a second layer of a second-conductivity-type, a third layer of the first-conductivity-type and the fourth layer of the second-conductivity-type. The second layer is provided between the first layer and the first electrode. The third layer is selectively provided between the second layer and the first electrode. The fourth layer is provided between the first layer and the second electrode. The second layer opposes the first to third control electrode with insulating films interposed.

7 Claims, 9 Drawing Sheets

Related U.S. Application Data division of application No. 16/573,593, filed on Sep. 17, 2019, now Pat. No. 11,101,375.

(51) Int. Cl.
*H01L 29/423* (2006.01)
*H01L 29/66* (2006.01)
*H03K 17/16* (2006.01)
*H03K 17/60* (2006.01)

(52) U.S. Cl.
CPC .... *H01L 29/66348* (2013.01); *H01L 29/7393* (2013.01); *H01L 29/7395* (2013.01); *H03K 17/16* (2013.01); *H03K 17/60* (2013.01)

(56) References Cited

U.S. PATENT DOCUMENTS

| | | | |
|---|---|---|---|
| 7,075,168 | B2 | 7/2006 | Sugiyama et al. |
| 8,421,184 | B2 | 4/2013 | Koyama et al. |
| 9,324,848 | B2 | 4/2016 | Sumitomo et al. |
| 9,515,067 | B2 | 12/2016 | Saikaku et al. |
| 9,595,602 | B2 | 3/2017 | Hashimoto et al. |
| 10,439,054 | B2 | 10/2019 | Ogura et al. |
| 2014/0209972 | A1* | 7/2014 | Sumitomo .......... H01L 29/4236 257/140 |
| 2017/0250260 | A1 | 8/2017 | Bina et al. |
| 2017/0301779 | A1 | 10/2017 | Naito |
| 2018/0083129 | A1 | 3/2018 | Kitagawa |
| 2019/0296133 | A1 | 9/2019 | Iwakaji et al. |
| 2020/0083879 | A1 | 3/2020 | Sho et al. |
| 2020/0091325 | A1 | 3/2020 | Matsudai et al. |
| 2020/0091326 | A1 | 3/2020 | Iwakaji et al. |
| 2020/0273971 | A1 | 8/2020 | Ishikawa et al. |
| 2020/0303524 | A1 | 9/2020 | Matsudai et al. |

FOREIGN PATENT DOCUMENTS

| | | |
|---|---|---|
| JP | 4398719 B2 | 1/2010 |
| JP | 4980743 B2 | 7/2012 |
| JP | 2013-251395 A | 12/2013 |
| JP | 2017-147468 A | 8/2017 |
| JP | 2018-46255 A | 3/2018 |
| JP | 2019-169597 A | 10/2019 |
| JP | 2020-47756 A | 3/2020 |
| JP | 2020-047789 A | 3/2020 |
| JP | 2020-047790 A | 3/2020 |
| WO | 2018/109794 A1 | 6/2018 |

\* cited by examiner

SEMICONDUCTOR DEVICE AND METHOD OF CONTROLLING SAME

CROSS-REFERENCE TO RELATED APPLICATIONS

This application is a continuation of U.S. application Ser. No. 17/383,837 filed on Jul. 23, 2021 which is a divisional of U.S. application Ser. No. 16/573,593 filed on Sep. 17, 2019 (now U.S. Pat. No. 11,101,375) and is based upon and claims the benefit of priority from Japanese Patent Application No. 2019-050702, filed on Mar. 19, 2019, and Japanese Patent Application No. 2019-166842, filed on Sep. 13, 2019; the entire contents of all of which are incorporated herein by reference.

FIELD

Embodiments relate to a semiconductor device and a method of controlling the same.

BACKGROUND

For example, an insulated gate bipolar transistor (hereinbelow, IGBT) is used as a semiconductor device controlling a large current under the high voltage of 600 V or more. For example, IGBT is used for power conversion in which both a low steady loss (a low on-resistance) and a low switching loss (a fast switching speed) are desirable to increase the conversion efficiency.

To reduce the on-resistance, many IGBTs of recent years have a trench gate structure extending deeply into the n-type base layer through the p-type base layer. Thereby, the channel density can be increased; carriers inside the n-type base layer can be accumulated efficiently by utilizing the configurations of the trench gates that are mutually-adjacent inside the n-type base layer; and the on-resistance can be reduced in the steady state. However, when a low on-resistance is realized by increasing the amount of the accumulated carriers, the carrier amount to be ejected is high while turning off. Therefore, the turn-off time lengthens; and the turn-off loss increases. In other words, there is a trade-off relationship between the decrease of the on-resistance and the decrease of the turn-off loss.

DETAILED DESCRIPTION

Figure 1:
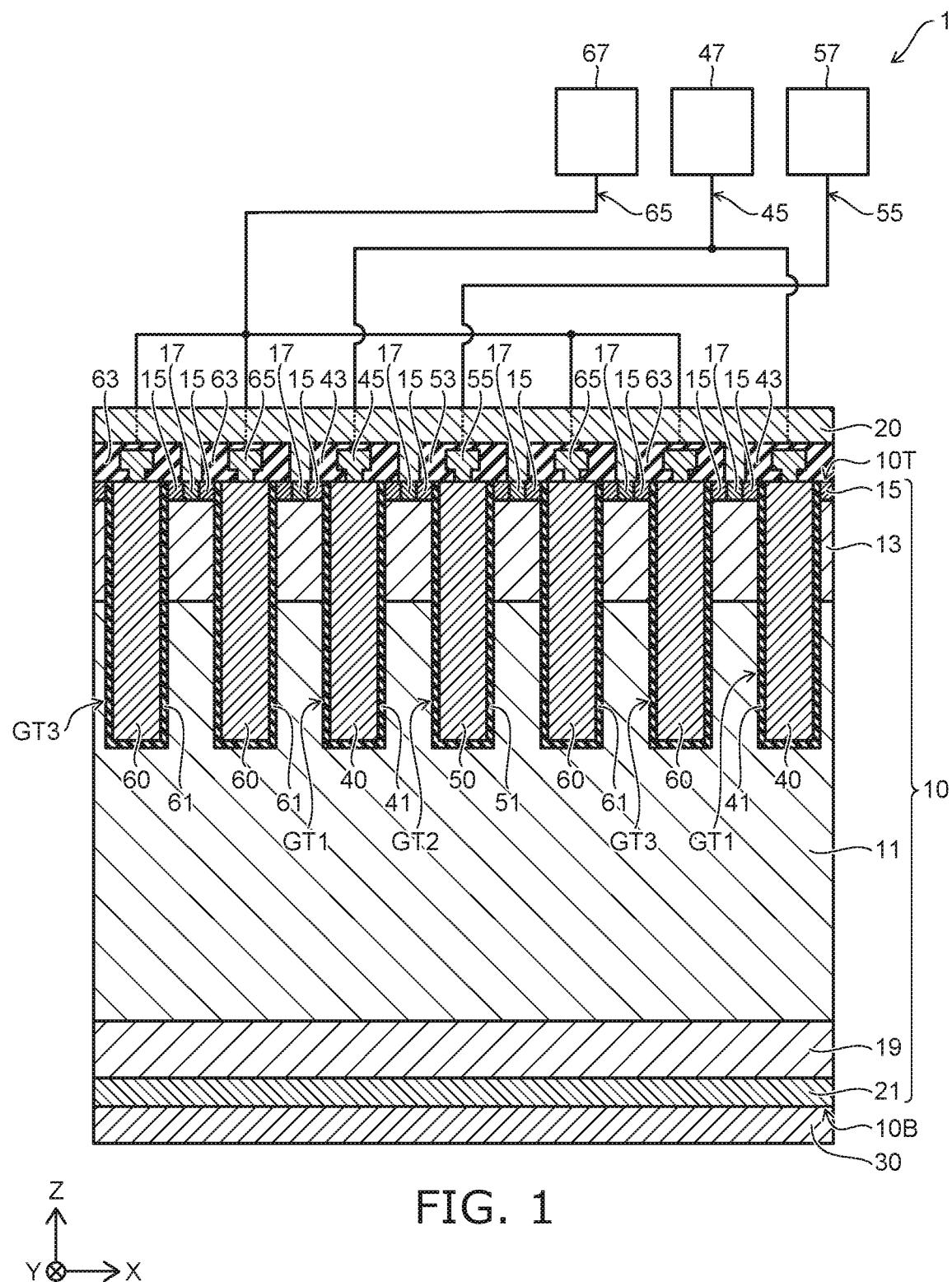
FIG. 1 is a schematic cross-sectional view showing a semiconductor device according to an embodiment.

According to one embodiment, a semiconductor device includes a semiconductor part including a first semiconductor layer of a first conductivity type, the semiconductor part having a first surface and a second surface, the second surface being positioned on a side opposite to the first surface; a first electrode provided on the first surface; a second electrode provided on the second surface; a first control electrode provided between the first electrode and the semiconductor part; a second control electrode provided between the first electrode and the semiconductor part; and a third control electrode provided between the first electrode and the semiconductor part. The first control electrode is electrically insulated from the semiconductor part by a first insulating film, and electrically insulated from the first electrode by a second insulating film. The second control electrode is electrically insulated from the semiconductor part by a third insulating film, and electrically insulated from the first electrode by a fourth insulating film. The second control electrode is biased independently from the first control electrode. The third control electrode is electrically insulated from the semiconductor part by a fifth insulating film, and electrically insulated from the first electrode by a sixth insulating film. The third control electrode is biased independently from the first control electrode and the second control electrode. The semiconductor part further includes a second semiconductor layer of a second conductivity type, a third semiconductor layer of the first conductivity type, and a fourth semiconductor layer of the second conductivity type. The second semiconductor layer is provided between the first semiconductor layer and the first electrode. The third semiconductor layer is selectively provided between the second semiconductor layer and the first electrode. The fourth semiconductor layer is provided between the first semiconductor layer and the second electrode. The second semiconductor layer opposes the first control electrode with the first insulating film interposed. The second semiconductor layer opposes the second control electrode with the second insulating film interposed. The second semiconductor layer opposes the third control electrode with the third insulating film interposed.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

FIG. 1 is a schematic cross-sectional view showing a semiconductor device 1 according to an embodiment. The semiconductor device 1 is, for example, an IGBT. The impurity distribution and the value of the impurity concentration of each semiconductor layer in the specification can be measured using, for example, secondary ion mass spectrometry (SIMS) or spreading resistance analysis (SRA). The relative high/low relationship of the impurity concentrations of two semiconductor layers can be determined using, for example, scanning capacitance microscopy (SCM). The relative high/low relationship and/or the absolute value of the carrier concentration of the semiconductor region are determined by SCM and SRA. By assuming the activation rate of the impurity, it is possible to determine the absolute value of the impurity concentration, the distribution of the impurity concentration, and the relative high/low relationship between the impurity concentrations of two semiconductor layers from the measurement results of SCM and SRA.

As shown in FIG. 1, the semiconductor device 1 includes a semiconductor part 10, an emitter electrode 20 (a first electrode), a collector electrode 30 (a second electrode), a first gate electrode 40, a second gate electrode 50, and a third gate electrode 60.

The semiconductor part 10 is, for example, silicon. The semiconductor part 10 has a first surface 10T and a second surface 10B. The second surface 10B is the back surface of the first surface 10T. The emitter electrode 20 is provided on the first surface 10T. The collector electrode 30 is provided in contact with the second surface 10B. The emitter electrode 20 and the collector electrode 30 include, for example, at least one selected from the group consisting of aluminum (Al), titanium (Ti), nickel (Ni), tungsten (W), gold (Au), and polysilicon.

The first gate electrode 40 is provided between the semiconductor part 10 and the emitter electrode 20. For example, the first gate electrode 40 is disposed inside a trench GT1 provided in the first surface 10T side of the semiconductor part 10. The first gate electrode 40 extends in the Y-direction inside the trench GT1. The first gate electrode 40 is electrically insulated from the semiconductor part 10 by a gate insulating film 41. Also, the first gate electrode 40 is electrically insulated from the emitter electrode 20 by an insulating film 43. The first gate electrode 40 includes, for example, conductive polysilicon. The gate insulating film 41 and the insulating film 43 are, for example, silicon oxide films.

The second gate electrode 50 is provided between the semiconductor part 10 and the emitter electrode 20. For example, the second gate electrode 50 is disposed inside a trench GT2 provided on the first surface 10T side of the semiconductor part 10. The second gate electrode 50 extends in the Y-direction inside the trench GT2. The second gate electrode 50 is electrically insulated from the semiconductor part 10 by a gate insulating film 51. Also, the second gate electrode 50 is electrically insulated from the emitter electrode 20 by an insulating film 53. The second gate electrode 50 includes, for example, conductive polysilicon. The gate insulating film 51 and the insulating film 53 are, for example, silicon oxide films.

The third gate electrode 60 is provided between the semiconductor part 10 and the emitter electrode 20. For example, the third gate electrode 60 is disposed inside a trench GT3 provided on the first surface 10T side of the semiconductor part 10. The third gate electrode 60 extends in the Y-direction inside the trench GT3. The third gate electrode 60 is electrically insulated from the semiconductor part 10 by a gate insulating film 61. Also, the third gate electrode 60 is electrically insulated from the emitter electrode 20 by an insulating film 63. The third gate electrode 60 includes, for example, conductive polysilicon. The gate insulating film 61 and the insulating film 63 are, for example, silicon oxide films.

The first gate electrode 40 is electrically connected to a first gate pad 47 via a first gate interconnect 45. The second gate electrode 50 is electrically connected to a second gate pad 57 via a second gate interconnect 55. The third gate electrode 60 is electrically connected to a third gate pad 67 via a third gate interconnect 65. In other words, the first gate electrode 40, the second gate electrode 50, and the third gate electrode 60 are biased independently.

The first gate electrode 40 and the second gate electrode 50 each are arranged periodically in a direction along the first surface 10T of the semiconductor part 10 (e.g., the X-direction). In the example shown in FIG. 1, the first gate electrode 40 and the second gate electrode 50 are arranged adjacent to each other in the X-direction. For example, at least one of the third gate electrodes 60 is disposed between the first gate electrode 40 and the second gate electrode 50. In the example, two of the third gate electrodes 60 are disposed between the first gate electrode 40 and the second gate electrode 50. Three or more of the third gate electrodes 60 may be disposed between the first gate electrode 40 and the second gate electrode 50.

The semiconductor part 10 includes an n-type base layer 11 (a first semiconductor layer), a p-type base layer 13 (a second semiconductor layer), an n-type emitter layer 15 (a third semiconductor layer), a p-type contact layer 17, an n-type buffer layer 19 (a fifth semiconductor layer), and a p-type collector layer 21 (a fourth semiconductor layer).

The n-type base layer 11 includes, for example, n-type impurities with a concentration range of $1 \times 10^{12}$ to $1 \times 10^{15}$ (atoms/cm$^3$). The n-type base layer 11 has an n-type carrier concentration at which a prescribed breakdown voltage can be achieved. Here, the n-type carrier concentration is, for example, the value obtained by subtracting the p-type impurity concentration from the n-type impurity concentration. For example, the p-type impurities with a background-level are included in the n-type silicon wafer used to form the n-type base layer 11. For example, the n-type base layer 11 has a thickness in the Z-direction in the range of 1 to 1000 μm and is set to a thickness at which the prescribed breakdown voltage can be achieved.

The p-type base layer 13 is selectively provided between the n-type base layer 11 and the emitter electrode 20. The p-type base layer 13 is electrically connected to the emitter electrode 20. For example, the p-type base layer 13 is provided to have a p-type impurity amount in the range of $1 \times 10^{12}$ to $1 \times 10^{14}$ cm$^{-2}$ and has a thickness in the Z-direction of 0.1 to several μm. For example, the p-type base layer 13 is formed by ion-implanting the p-type impurities on the first surface 10T side of the semiconductor part 10.

The n-type emitter layer 15 is selectively provided between the p-type base layer 13 and the emitter electrode 20. The n-type emitter layer 15 includes n-type impurities with a higher concentration than the concentration of n-type impurities in the n-type base layer 11. For example, the emitter electrode 20 contacts the n-type emitter layer 15 and is electrically connected to the n-type emitter layer 15.

For example, the n-type emitter layer 15 is provided to have an n-type impurity amount in the range of $1 \times 10^{14}$ to $1 \times 10^{16}$ cm$^{-2}$ and has a thickness in the Z-direction of 0.1 to several μm. For example, the n-type emitter layer 15 is formed by selectively ion-implanting the n-type impurity on the first surface 10T side of the semiconductor part 10.

The p-type contact layer 17 is selectively provided between the p-type base layer 13 and the emitter electrode 20. The p-type contact layer 17 includes p-type impurities with a higher concentration than the concentration of p-type impurities in the p-type base layer 13. For example, the emitter electrode 20 contacts the p-type contact layer 17 and is electrically connected to the p-type contact layer 17. The p-type base layer 13 is electrically connected to the emitter electrode 20 via the p-type contact layer 17.

For example, the p-type contact layer 17 is provided to have a p-type impurity amount in the range of $1 \times 10^{14}$ to $1 \times 10^{16}$ cm$^{-2}$ and has a thickness in the Z-direction in the range of 0.1 to several μm. For example, the p-type contact layer 17 is formed by selectively ion-implanting the p-type impurities on the first surface 10T side of the semiconductor part 10.

For example, the n-type emitter layer 15 and the p-type contact layer 17 may be arranged alternately in the longitudinal direction of the trenches GT1 to GT3 (e.g., the Y-direction). The ratio of the surface areas of the p-type contact layer 17 and the n-type emitter layer 15, which are exposed at the first surface 10T of the semiconductor part 10, can be changed freely according to the desired design. Moreover, the n-type emitter layer 15 and the p-type contact layer 17 may have the surfaces that have freely designed configuration exposed at the first surface 10T of the semiconductor part 10.

The trenches GT1 to GT3 have depths capable of reaching the n-type base layer 11 from the first surface 10T of the semiconductor part 10 through the n-type emitter layer 15 and the p-type base layer 13. The trenches GT1 to GT3 are provided periodically in a direction along the first surface 10T of the semiconductor part 10 (e.g., the X-direction). For example, the depths of the trenches GT1 to GT3 each are set in the range of 1 to 10 μm. For example, the spacing of mutually-adjacent trenches in the X-direction are set in the range of 0.1 to several μm between the trench GT1 and trench GT2, between the trench GT1 and trench GT3, and between the trench GT2 and trench GT3.

For example, the n-type base layer 11, the p-type base layer 13, and the n-type emitter layer 15 are exposed at the side surfaces of the trenches GT1 to GT3. The first gate electrode 40 is inside the trench GT1 and opposes the p-type base layer 13, which is positioned between the n-type base layer 11 and the n-type emitter layer 15, with the gate insulating film 41 interposed. The second gate electrode 50 is inside the trench GT2 and opposes the p-type base layer 13, which is positioned between the n-type base layer 11 and the n-type emitter layer 15, with the gate insulating film 51 interposed. The third gate electrode 60 is inside the trench GT3 and opposes the p-type base layer 13, which is positioned between the n-type base layer 11 and the n-type emitter layer 15, with the gate insulating film 61 interposed.

For example, the trench gate structure recited above is multiply provided and arranged periodically along the first surface 10T of the semiconductor part 10. For example, the spacing between the trench gate structures is set in the range of 0.1 to several μm.

The n-type buffer layer 19 is provided between the n-type base layer 11 and the collector electrode 30. The n-type buffer layer 19 includes n-type impurities with a higher concentration than the concentration of n-type impurities in the n-type base layer 11. For example, the n-type buffer layer 19 is provided to have an n-type impurity amount in the range of $1 \times 10^{11}$ to $1 \times 10^{13}$ cm$^{-2}$ and has a thickness in the Z-direction in the range of 0.1 to the several tens of μm. For example, the n-type buffer layer 19 is formed by ion-implanting the n-type impurities on the second surface 10B side of the semiconductor part 10.

The p-type collector layer 21 is provided between the n-type buffer layer 19 and the collector electrode 30. For example, the p-type collector layer 21 is provided to have a p-type impurity amount in the range of $1 \times 10^{13}$ to $1 \times 10^{15}$ cm$^{-2}$ and has a thickness in the Z-direction in the range of 0.1 to 10 μm.

For example, the p-type collector layer 21 is formed by ion-implanting p-type impurities into the semiconductor part 10 through the whole second surface 10B or the selected portion thereof. For example, the total amount of the p-type impurities is set in the range of $1 \times 10^{13}$ to $1 \times 10^{15}$ cm$^{-2}$. For example, the implantation energy when forming the p-type collector layer 21 is set to be lower than the implantation energy when forming the n-type buffer layer 19. Therefore, the implantation depth of the p-type impurities is shallower than the implantation depth of the n-type impurities in the n-type buffer layer 19.

At the second surface 10B of the semiconductor part 10, the collector electrode 30 contacts the surface of the p-type collector layer 21 and is electrically connected to the p-type collector layer 21.

Figure 2:
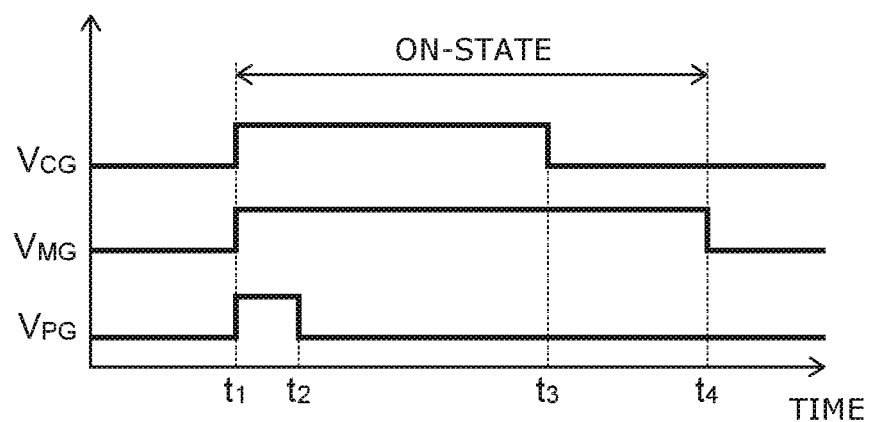
FIG. 2 is a time chart showing an operation of the semiconductor device according to the embodiment.
Figure 3A:
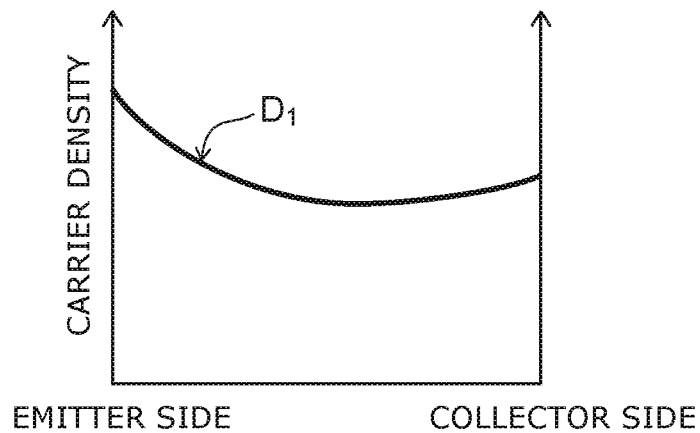
FIGS. 3A to 3C are schematic views showing the operation of the semiconductor device according to the embodiment.
Figure 3B:
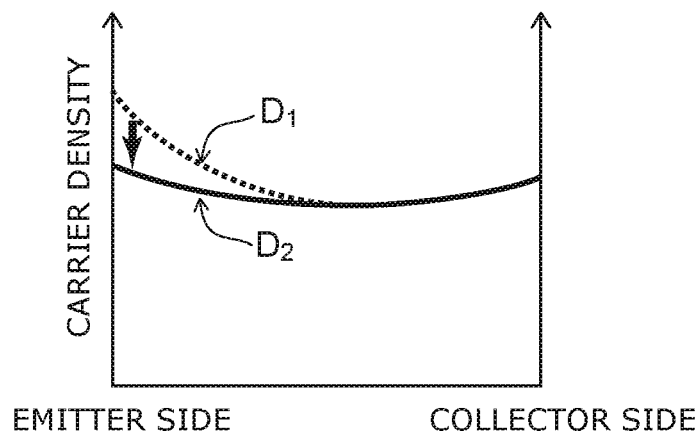
Figure 3C:
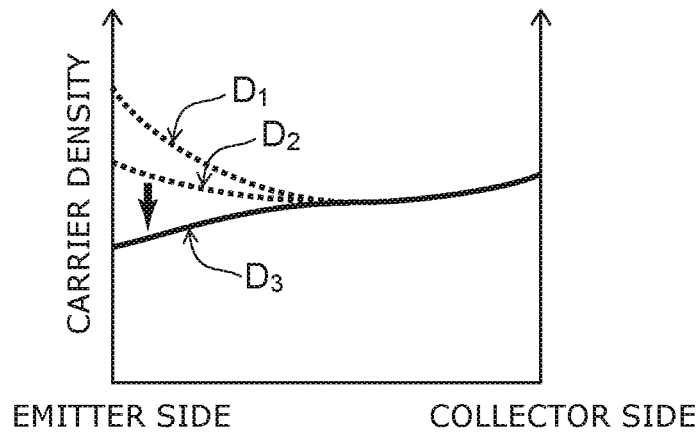

An operation of the semiconductor device 1 according to the embodiment will now be described with reference to FIG. 1, FIG. 2, and FIGS. 3A to 3C. FIG. 2 is a time chart showing a method of controlling the semiconductor device 1. FIG. 2 shows the process of turning on and subsequently turning off the semiconductor device 1. FIGS. 3A to 3C are schematic views showing the operation of the semiconductor device 1. The carrier density distribution inside the n-type base layer 11 is shown in FIGS. 3A to 3C. Here, the carrier density is the density including both electrons and holes.

FIG. 2 is a time chart showing the time-dependent change of a gate voltage $V_{MG}$ applied to the first gate electrode 40, a gate voltage $V_{CG}$ applied to the second gate electrode 50, and a gate voltage $V_{PG}$ applied to the third gate electrode 60. Here, the gate voltage $V_{MG}$ is applied to the first gate electrode 40 via the first gate pad 47 and the first gate interconnect 45. The gate voltage $V_{CG}$ is applied to the second gate electrode 50 via the second gate pad 57 and the second gate interconnect 55. The gate voltage $V_{PG}$ is applied to the third gate electrode 60 via the third gate pad 67 and the third gate interconnect 65.

At first, explained is the turning on process. For example, when turning on the semiconductor device 1, the gate voltages $V_{MG}$, $V_{CG}$, and $V_{PG}$ that exceed the thresholds are applied to the first gate electrode 40, the second gate electrode 50, and the third gate electrode 60. Hereinbelow, applying a gate voltage that exceeds the threshold to each gate electrode is called ON; and reducing the gate voltage of each gate electrode to a voltage not more than the threshold is called OFF.

As shown in FIG. 2, the first gate electrode 40, the second gate electrode 50, and the third gate electrode 60 are turned on at a time $t_1$. Thereby, n-type channels are formed at the interface between the p-type base layer 13 and the gate insulating film 41, the interface between the p-type base layer 13 and the gate insulating film 51, and the interface between the p-type base layer 13 and the gate insulating film 61; and the electric conduction is provided between the n-type base layer 11 and the n-type emitter layer 15. In other words, the semiconductor device 1 is set to the on-state.

Moreover, at portions of the first gate electrode 40, the second gate electrode 50, and the third gate electrode 60, which are positioned inside the n-type base layer 11, n-type accumulation layers are formed at the interface between the n-type base layer 11 and the gate insulating film 41, the interface between the n-type base layer 11 and the gate insulating film 51, and the interface between the n-type base layer 11 and the gate insulating film 61. The n-type accumulation layers influence and enhance the carrier accumulation in each region of the n-type base layer 11 positioned between the gate electrodes is promoted; and the lower on-resistance can be obtained in the turned-on state.

FIG. 3A is a schematic view illustrating a carrier density distribution $D_1$ inside the n-type base layer 11 in such a state. By turning on the first gate electrode 40, the second gate electrode 50, and the third gate electrode 60, electrons are injected from the emitter electrode 20 into the n-type base layer 11; and holes that correspond to the electron injection are injected from the p-type collector layer 21 into the n-type base layer 11 via the n-type buffer layer 19. As shown in FIG. 3A, the carrier density inside the n-type base layer 11 is high on the emitter side. Thus, all of the first gate electrode 40, the second gate electrode 50 and the third gate electrode 60 are turned on, and the turn-on time can be reduced.

Then, as shown in FIG. 2, the third gate electrode 60 is turned off at a time $t_2$. Thereby, the n-type channel disappears, which is induced at the interface between the p-type base layer 13 adjacent to the third gate electrode 60 and the gate insulating film 61. Therefore, the electric conduction is disconnected between the n-type emitter layer 15 and the n-type base layer 11 on the third gate electrode 60 side; and the supply of the electrons to the n-type base layer 11 stops. Accordingly, the amount of the holes injected from the p-type collector layer 21 into the n-type base layer 11 via the n-type buffer layer 19 also decreases.

FIG. 3B is a schematic view showing the change of the carrier density distribution in this process. By turning off the third gate electrode 60, the carrier density on the emitter side decreases in the n-type base layer 11; and the density distribution changes from $D_1$ to $D_2$.

Then, explained is the turn off process. As shown in FIG. 2, the second gate electrode 50 is turned off at a time $t_3$.

The n-type channel disappears, which is induced at the interface between the p-type base layer 13 adjacent to the second gate electrode 50 and the gate insulating film 51; and the electric conduction also is disconnected between the n-type emitter layer 15 and the n-type base layer 11. Therefore, the supply of the electrons to the second gate electrode 50 side stops. Accordingly, the amount of the holes injected from the p-type collector layer 21 into the n-type base layer 11 via the n-type buffer layer 19 also decreases.

FIG. 3C is a schematic view showing the change of the carrier density distribution in this process. By turning off the second gate electrode 50, the carrier density on the emitter side decreases further in the n-type base layer 11; and the density distribution changes from $D_2$ to $D_3$.

Then, by turning off the first gate electrode 40 at a time $t_4$, the injection of electrons from the n-type emitter layer 15 into the n-type base layer 11 stops completely; and the turn-off operation starts in the semiconductor device 1. In the example, the second gate electrode 50 is turned off before the first gate electrode 40 is turned off; therefore, the density of carriers accumulated in the n-type base layer 11 have decreased on the emitter side. In other words, the carrier density is lower than the steady state in which the first gate electrode 40 and the second gate electrode 50 both are turned on. The carriers that are ejected in the turn-off process after turning off the first gate electrode 40 can be reduced thereby. In other words, compared to the case where the second gate electrode 50 is not provided, the turn-off time can be shortened; and the turn-off loss can be reduced.

When the potential of the second gate electrode 50 is further reduced to a negative potential, a p-type inversion layer is induced at the interface between the n-type base layer 11 and the gate insulating film 51. The ejection of the holes into the emitter electrode 20 via the p-type base layer 13 can be promoted thereby. As a result, the turn-off loss can be reduced further.

In the semiconductor device 1 according to the embodiment, the turn-on time can be shortened by appropriately controlling the third gate electrode 60. Also, in the turn-off process, the turn-off time can be shortened by appropriately controlling the second gate electrode 50. As a result, in the semiconductor device 1, the switching loss can be reduced while maintaining the on-resistance.

Figure 4:
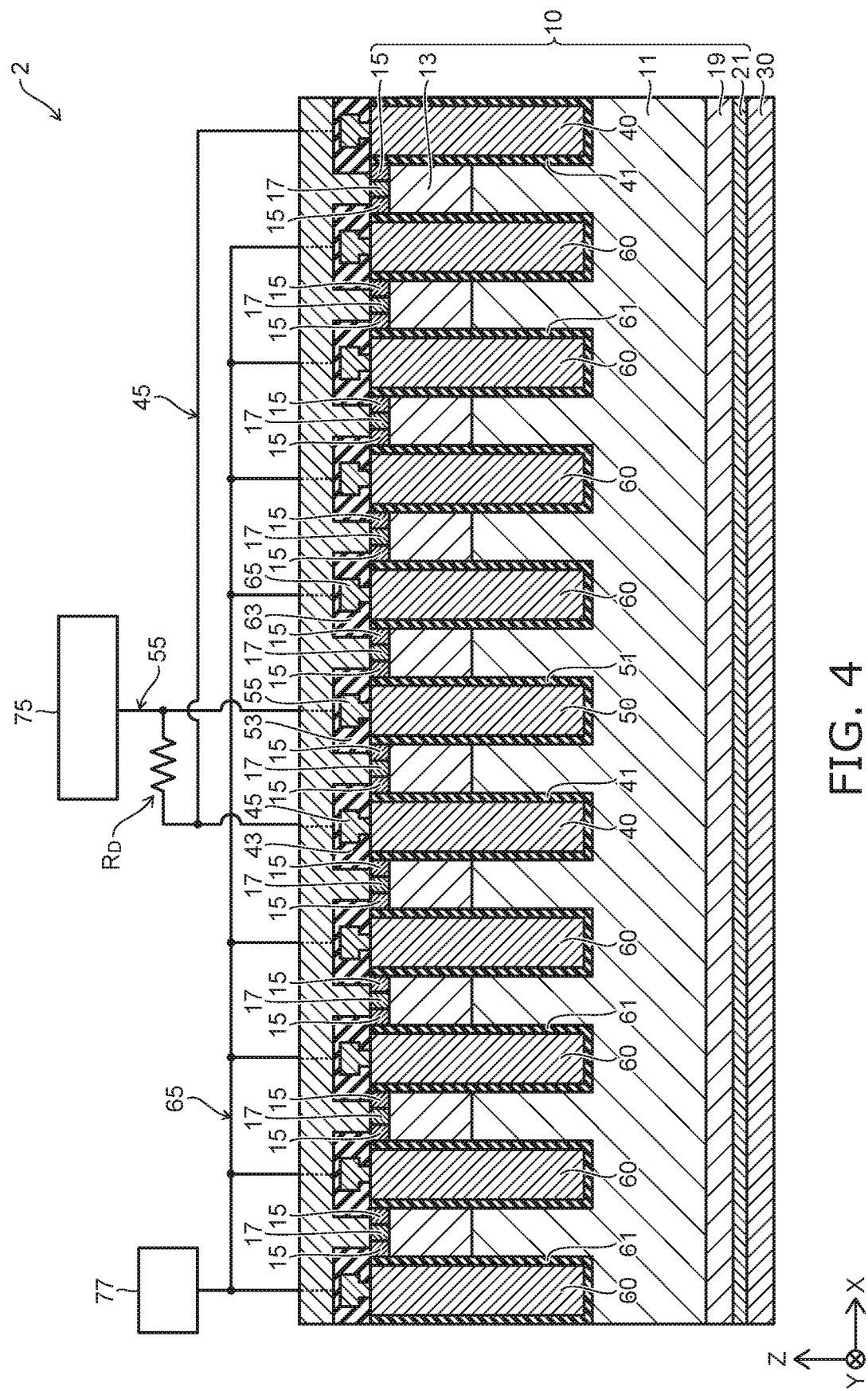
FIG. 4 is a schematic cross-sectional view showing a semiconductor device according to a modification of the embodiment.

FIG. 4 is a schematic cross-sectional view showing a semiconductor device 2 according to a modification of the embodiment.

In the semiconductor device 2 shown in FIG. 4, four of the third gate electrodes 60 are disposed between the first gate electrode 40 and the second gate electrode 50. The number of the third gate electrodes 60 is an example and is not limited to the example. The semiconductor device 2 also includes a first gate pad 75 and a second gate pad 77.

As shown in FIG. 4, the first gate electrode 40 is connected to the first gate interconnect 45. The second gate electrode 50 is connected to the second gate interconnect 55. The third gate electrode 60 is connected to the third gate interconnect 65. The second gate interconnect 55 is linked to the first gate pad 75; and the third gate interconnect 65 is linked to the second gate pad 77.

The semiconductor device 2 further includes a resistance element $R_D$ linking the first gate interconnect 45 and the second gate interconnect 55. For example, the resistance element $R_D$ is a semiconductor or a metal body that has the desired resistance value. For example, the resistance element $R_D$ is placed in the terminal region of the semiconductor part 10, and provided on the first surface 10T with an insulating film interposed. The resistance element $R_D$ may be placed at the periphery of the semiconductor part 10 and may be connected to the first gate interconnect 45 and the second gate interconnect 55 by a metal interconnect, for example.

In the semiconductor device 2, the gate voltages $V_{MG}$ and $V_{CG}$ are respectively applied to the first gate electrode 40 and the second gate electrode 50 via the first gate pad 75. The gate voltage $V_{PG}$ is applied to the third gate electrode 60 via the second gate pad 77.

When the semiconductor device 2 is turned on, the gate voltages $V_{MG}$, $V_{CG}$, and $V_{PG}$ that are higher than the thresholds are applied to the first gate electrode 40, the second gate electrode 50, and the third gate electrode 60 via the first gate pad 75 and the second gate pad 77. At this time, a delay in the rise of the voltage applied to the first gate electrode 40 occurs due to the RC time constant due to the resistance element $R_D$ and a parasitic capacitance C. Therefore, the first gate electrode 40 is turned on after the second gate electrode 50 is turned on. Then, the third gate electrode 60 is turned off at the time $t_2$. The n-type channel disappears, which is induced at the interface between the p-type base layer 13 adjacent to the third gate electrode 60 and the gate insulating film 61. Therefore, the electric conduction is disconnected between the n-type emitter layer 15 and the n-type base layer 11 on the third gate electrode 60 side; and the supply of the electrons to the n-type base layer 11 stops. Accordingly, the amount of the holes injected from the p-type collector layer 21 into the n-type base layer 11 via the n-type buffer layer 19 also decreases. At this time, for example, the turn-on operation can be faster by setting a number of the third gate electrodes larger than the number of the first gate electrodes.

The turn-off operation will be described as follows. The first gate electrode 40 and the second gate electrode 50 are turned off via the first gate pad 75. At this time, a delay in the fall of the voltage applied to the first gate electrode 40 occurs by the RC time constant due to the resistance element $R_D$ and the parasitic capacitance C. Therefore, the first gate electrode 40 is turned off after the second gate electrode 50 is turned off. In other words, the second gate electrode 50 is turned off before the first gate electrode 40 is turned off and the turn-off process is started; and the carrier density inside the n-type base layer 11 is reduced. As a result, the turn-off time of the semiconductor device 2 can be shortened; and the switching loss can be reduced.

In the example as well, the turn-on time can be shortened by appropriately controlling the third gate electrode 60; and the turn-off time can be shortened by appropriately controlling the off-timing of the first gate electrode 40 with respect to the off-timing of the second gate electrode 50. The delay of the time for turning off the first gate electrode 40 can be controlled by placing the resistance element $R_D$ that has the desired resistance value.

Figure 5:
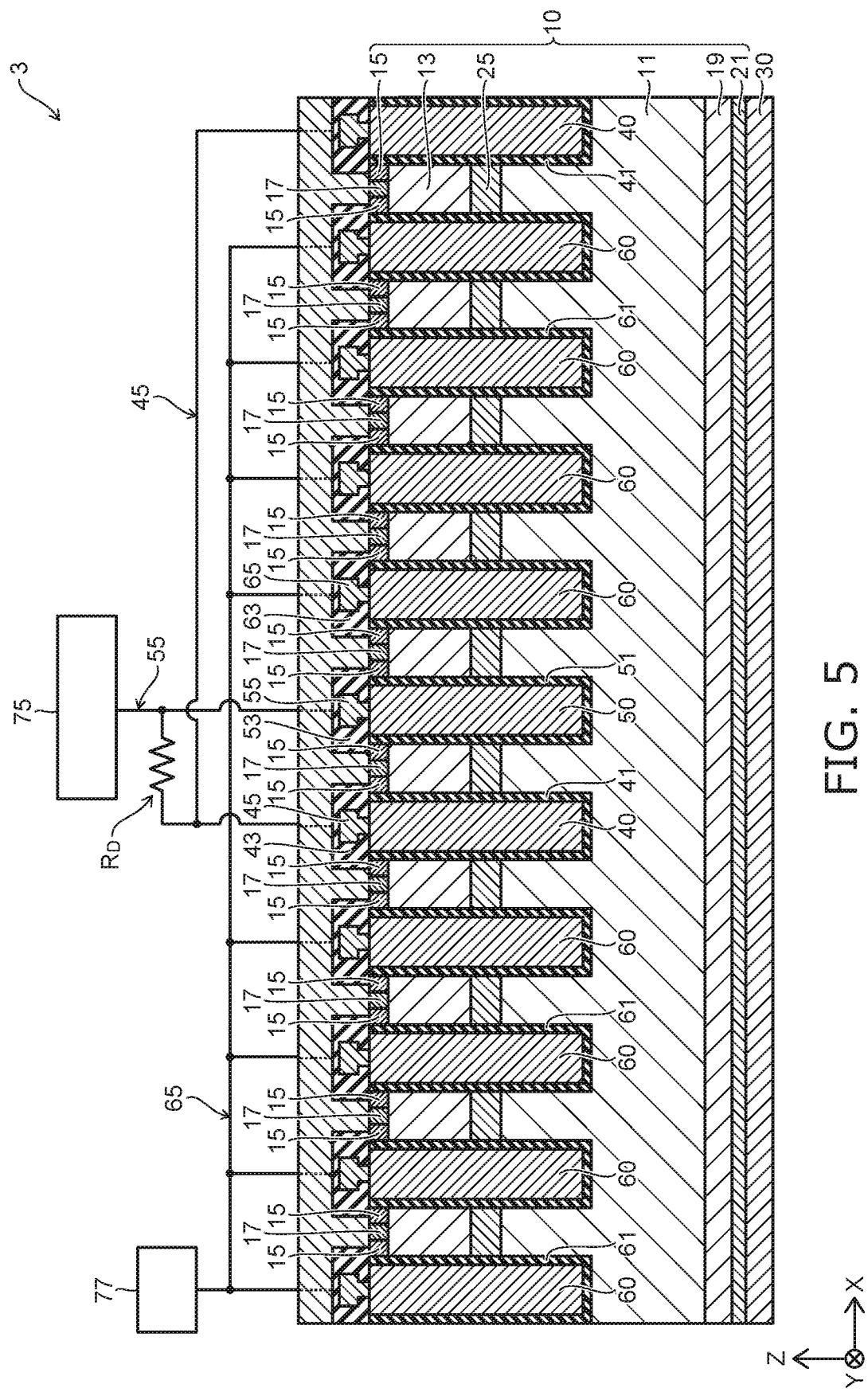
FIG. 5 is a schematic cross-sectional view showing a semiconductor device according to another modification of the embodiment.

FIG. 5 is a schematic cross-sectional view showing a semiconductor device 3 according to another modification of the embodiment.

The semiconductor device 3 shown in FIG. 5 also includes the first gate pad 75 and the second gate pad 77. The semiconductor part 10 of the semiconductor device 3 further includes an n-type barrier layer 25 (a sixth semiconductor layer) positioned between the n-type base layer 11 and the p-type base layer 13.

The n-type barrier layer 25 includes the n-type impurities with a higher concentration than the concentration of n-type impurities in the n-type base layer 11. Also, the n-type barrier layer 25 includes the n-type impurities with a lower concentration than the concentration of n-type impurities in the n-type emitter layer 15. For example, the n-type barrier layer 25 is provided to have an n-type impurity amount in the range of $1\times10^{12}$ to $1\times10^{14}$ cm$^{-2}$ and has a thickness in the Z-direction in the range of 0.1 to several μm. For example, the n-type barrier layer 25 is formed by ion-implanting the n-type impurities on the first surface 10T side of the semiconductor part 10.

In the semiconductor device 3, the turn-on time can be shortened by appropriately controlling the third gate electrode 60 at turn-on. Further, when the semiconductor device 3 is turned off, by delaying the off-timing of the first gate electrode 40 with respect to the off-timing of the second gate electrode 50, the switching loss can be reduced while maintaining the on-resistance. In the example, by adding the n-type barrier layer 25, the carrier accumulation on the emitter side can be promoted further in the n-type base layer 11 during the turn-on (i.e., during the steady state); and the lower on-resistance is achieved. Thus, it is possible to shorten the turn-on time and the turn-off time and reduce the on-resistance more effectively by providing the n-type barrier layer 25.

Figure 6:
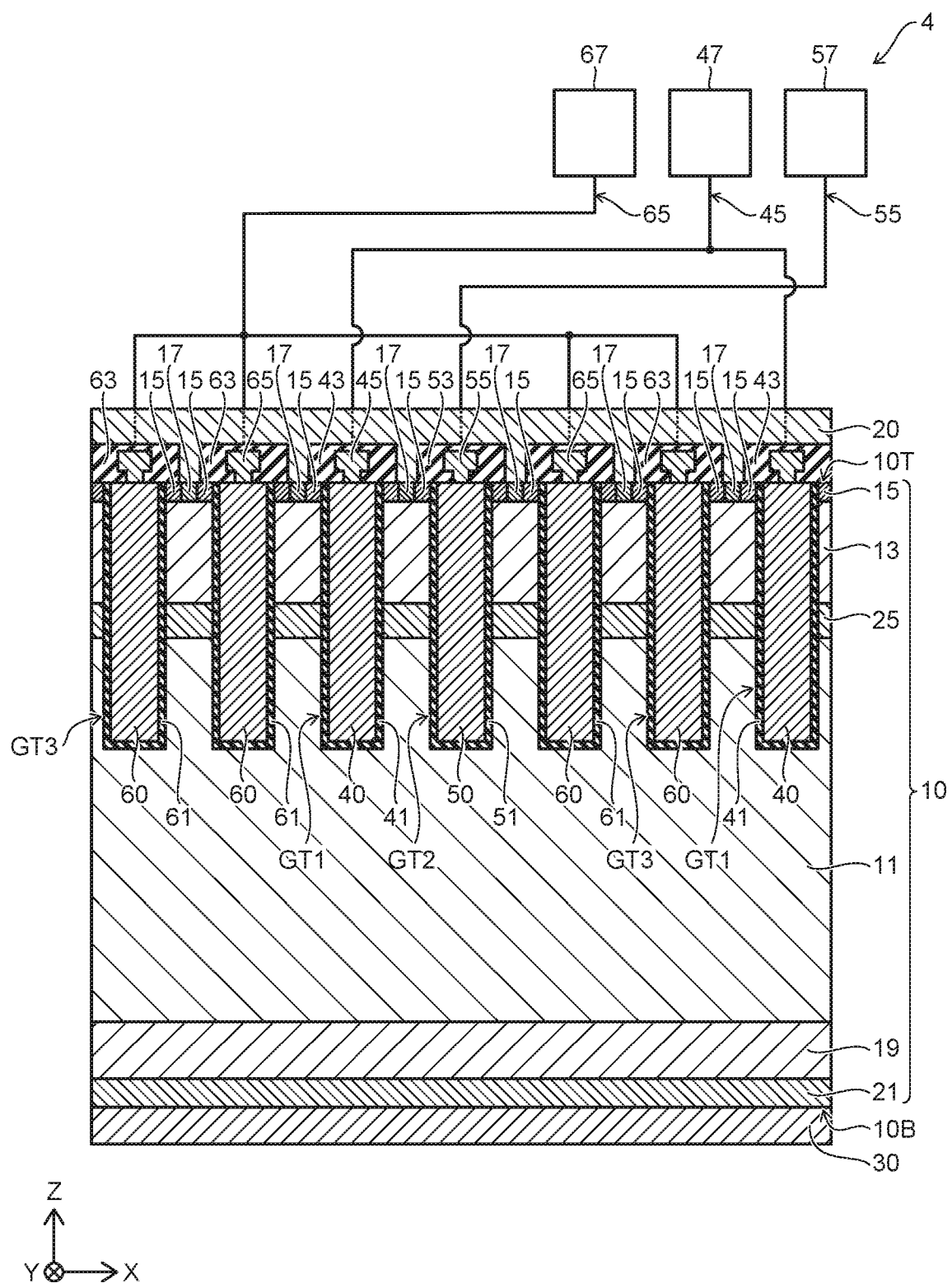
FIG. 6 is a schematic cross-sectional view showing a semiconductor device according to yet another modification of the embodiment.

FIG. 6 is a schematic cross-sectional view showing a semiconductor device 4 according to yet another modification of the embodiment. The semiconductor device 4 has the structure similar to the semiconductor device 1 shown in FIG. 1. The semiconductor part 10 of the semiconductor device 4 further includes an n-type barrier layer 25 between the n-type base layer 11 and the p-type base layer 13. The n-type barrier layer 25 includes n-type impurities with a concentration higher than a concentration of n-type impurities in the n-type base layer 11.

Also in the semiconductor device 4, a lower on-resistance can be achieved by adding the n-type barrier layer 25.

Figure 7:
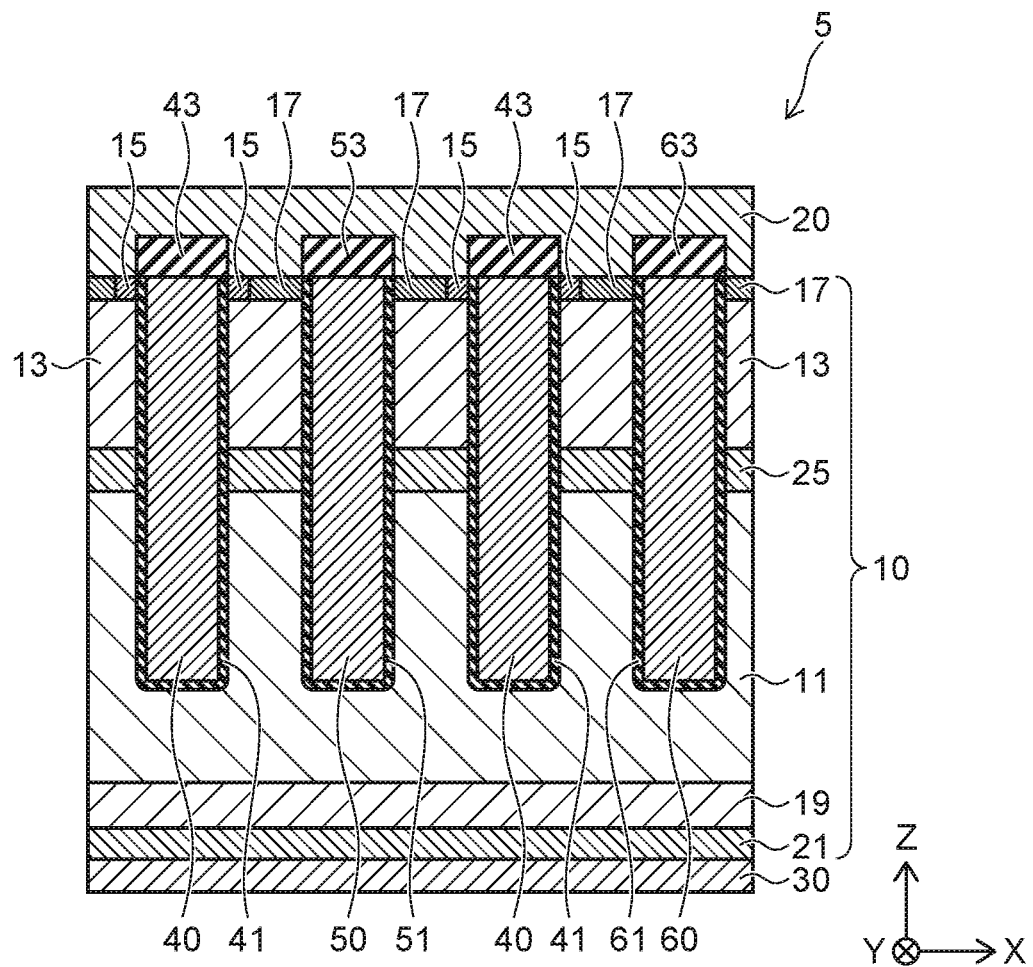
FIG. 7 is a schematic cross-sectional view showing a semiconductor device according to other modification of the embodiment.

FIG. 7 is a schematic cross-sectional view showing a semiconductor device 5 according to other modification of the embodiment. The semiconductor device 5 includes the first gate electrode 40, the second gate electrode 50, and the third gate electrode 60. The first gate electrode 40, the second gate electrode 50, and the third gate electrode 60 are electrically connected to, for example, the first gate pad 47, the second gate pad 57, and the third gate pad 67, respectively, and can be biased independently (see FIG. 1).

As shown in FIG. 7, the first gate electrode is provided in a plurality, and the second gate electrode 50 is positioned between the first gate electrodes 40, for example. Moreover, the first gate electrode is disposed so as to be positioned between the second gate electrode 50 and the third gate electrode 60, for example.

The semiconductor part 10 includes the n-type base layer 11, the p-type base layer 13, the n-type emitter layer 15, the p-type contact layer 17, the n-type buffer layer 19, the p-type collector layer 21 and an n-type barrier 25. The embodiment may include a structure without the n-type barrier layer 25.

The n-type emitter layer 15 is disposed to be in contact with the gate insulating film 41. The first gate electrode 40 is disposed so as to oppose the n-type base layer 11, the n-type barrier layer 25, the p-type base layer 13, and the n-type emitter layer 15 with the gate insulating film 41 interposed. The second gate electrode 50 is disposed so as to oppose the n-type base layer 11, the n-type barrier layer 25, the p-type base layer 13 and the p-type contact layer 17 with the insulating film 51 interposed. The third gate electrode 60 is disposed so as to oppose the n-type base layer 11, the n-type barrier layer 25, the p-type base layer 13, and the p-type contact layer 17 with the gate insulating film 61 interposed.

Figure 8:
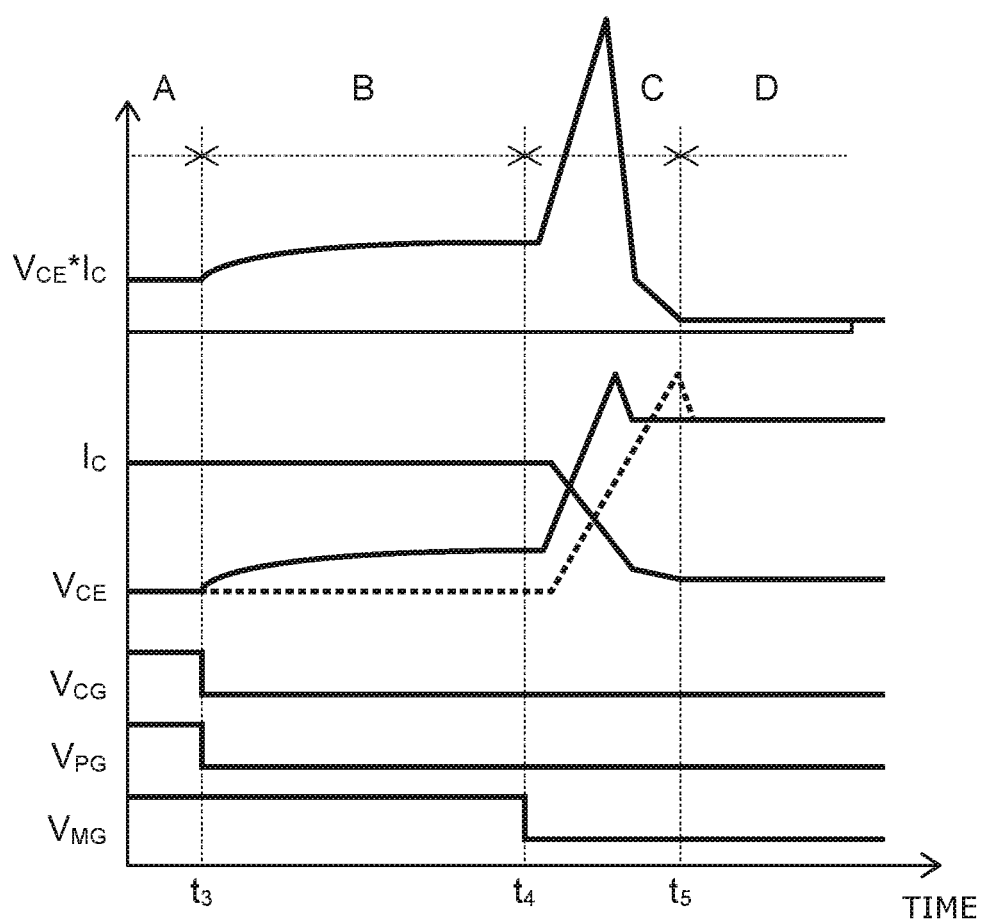
FIG. 8 is a time chart showing an operation of the semiconductor device according to the other modification of the embodiment.
Figure 9A:
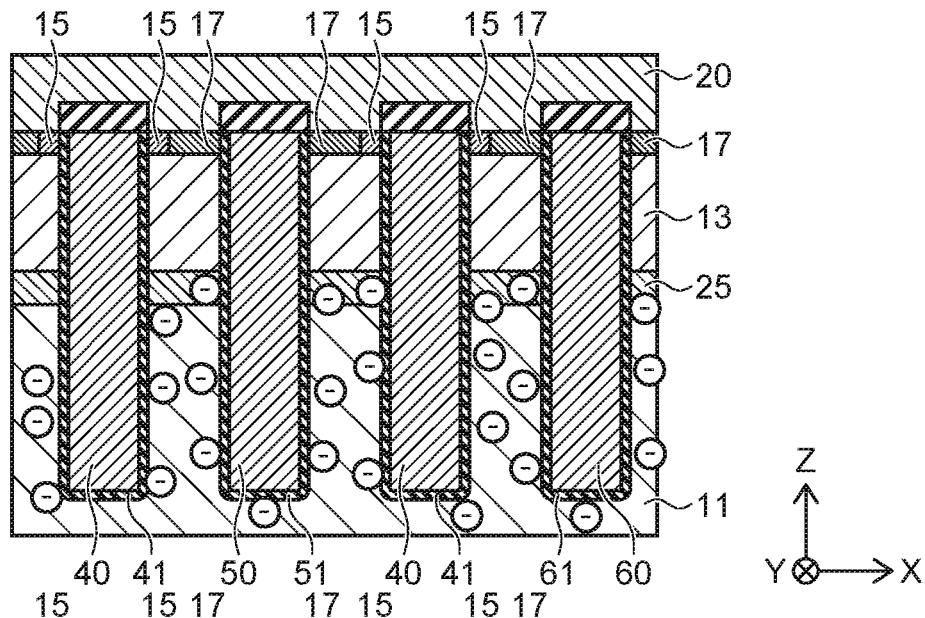
FIGS. 9A to 9C are schematic views showing the operation of the semiconductor device according to the other modification of the embodiment
Figure 9B:
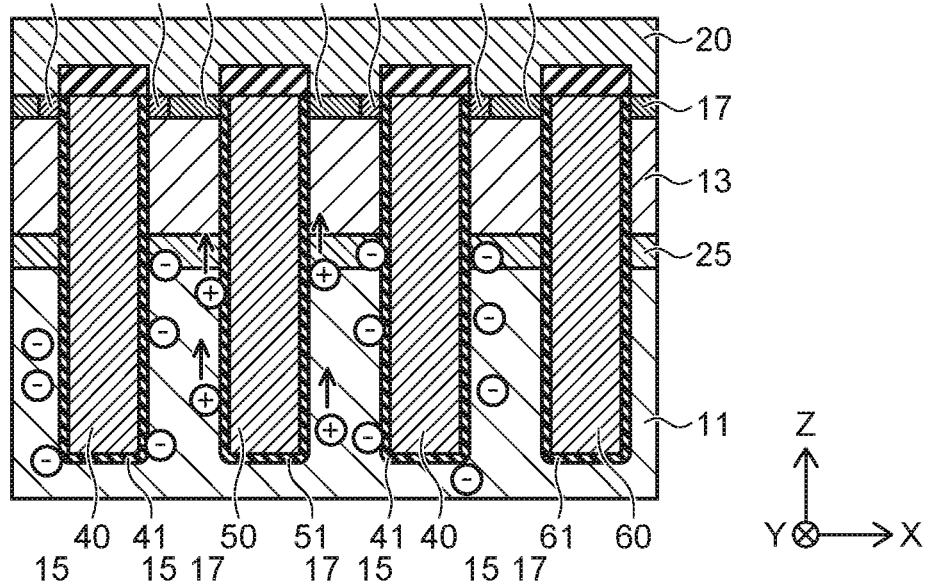
Figure 9C:
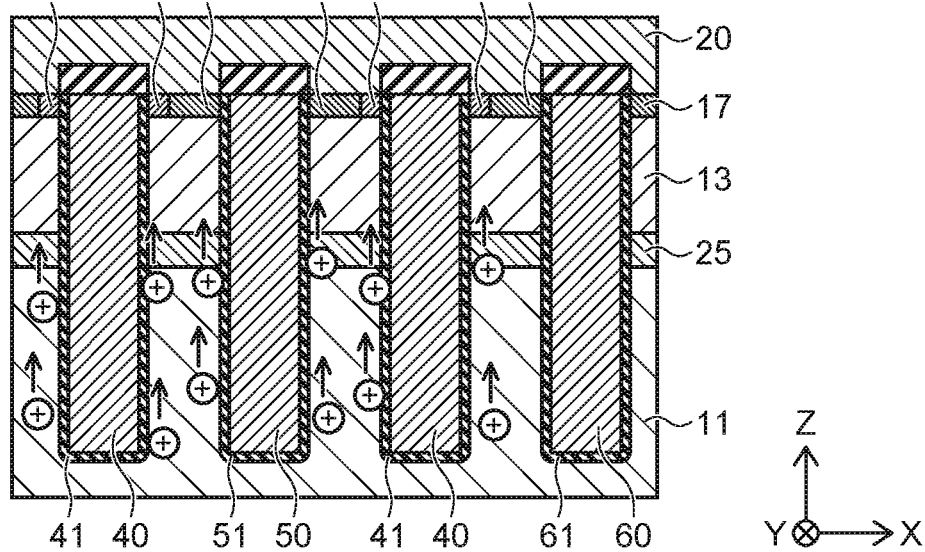

FIGS. 8 and 9A to 9C are schematic views showing the operation of the semiconductor device 5. FIG. 8 is a time chart showing temporal changes of the gate voltages $V_{MG}$, $V_{CG}$, $V_{PG}$, the emitter-collector voltage $V_{CE}$, and the collector current $I_C$. FIGS. 9A to 9C are schematic views showing carriers in the semiconductor part 10 in the periods A, B and C shown in FIG. 8. Then, the operation of the semiconductor device 5 will be described with reference to FIGS. 8 and 9A to 9C.

FIG. 8 shows gate voltages $V_{MG}$, $V_{CG}$, and $V_{PG}$ applied to the first gate electrode 40, the second gate electrode 50, and the third gate electrode 60, respectively, during the turn-off process of the semiconductor device 5 shifted from the on state to the off state. The collector current $I_C$ and the emitter-collector electrode voltage $V_{CE}$ are also shown, which are changed with the gate voltages $V_{MG}$, $V_{CG}$, and $V_{PG}$. In the following description, it is assumed that the potential of the emitter electrode 20 is at the ground potential (i.e., zero level).

In the ON state, for example, the positive gate voltage $V_{MG}$ equal to or higher than the threshold value is applied to the first gate electrode 40, and the positive gate voltages $V_{CG}$ and $V_{PG}$ are applied to the second gate electrode 50 and the third gate electrode 60, respectively.

As shown in FIG. 8, in the turn-off process of the semiconductor device 5, after the second gate electrode 50 and the third gate electrode 60 are turned off at time $t_3$, the first gate electrode 40 is turned off at time $t_4$. For example, the gate voltage $V_{CG}$ is decreased at time $t_3$ from a positive voltage (for example, +15V) to a negative voltage (for example, —15V). Further, the gate voltage $V_{PG}$ is reduced at time $t_3$ from a plus voltage (for example, +15V) to a zero level. Subsequently, the gate voltage VMS is reduced at time $t_4$, from a positive voltage (for example, +15 V) to a zero level.

FIG. 9A shows the distribution of carriers (electrons) in the semiconductor part 10 in the period A. In the period A, the first gate electrode 40 is turned on, and makes it possible to inject the electrons into the n-type barrier layer 15 and further into the n-type base layer 11 from the n-type emitter layer 15 through the n-type channel induced at the interface between the p-type base layer 13 and the gate insulating film 41. Correspondingly, on the collector side (not shown), holes are injected from the p-type collector layer 21 into the n-type base layer 11, and a collector current $I_C$ (i.e., ON current) flows.

Further, by the gate voltages $V_{CG}$ and $V_{PG}$ (positive voltage) applied to the second gate electrode 50 and the third gate electrode 60, the n-type accumulation layers are induced at the interfaces between the n-type base layer 11 and the gate insulating film 51, between the n-type barrier layer 25 and the gate insulating film 51, between the n-type base layer 11 and the gate insulating film 61, and between the n-type barrier layer 25 and the gate insulating film 61. Thereby, the holes injected from the p-type collector layer 21 into the n-type base layer 11 further increases. As a result, the carrier amount in the n-type base layer 11 and the n-type barrier layer 25 is increased, and makes the on-resistance lower. In the period A shown in FIG. 8, the emitter-collector electrode voltage $V_{CE}$ corresponding to the collector current $I_C$ is suppressed by the reduced on-resistance, and thus, the power consumption $V_{CE}*I_C$ can be reduced.

In the period B shown in FIG. 8, the second gate electrode 50 and the third gate electrode 60 are turned off. As shown in FIG. 9B, the n-type accumulation layers disappear, which are induced at the interfaces between the n-type base layer 11 and the gate insulating film 51, between the n-type barrier layer 25 and the gate insulating film 51, between the n-type base layer 11 and the gate insulating film 61, and between the n-type barrier layer 25 and the gate insulating film 61. Thereby, the amount of holes injected from the p-type collector layer 21 to the n-type base layer 11 is reduced. In contrast, as the first gate electrode 40 remains in the on state, the collector current $I_C$ continues to flow. That is, the electron injection from the n-type emitter layer 15 into the n-type barrier layer 25 and the n-type base layer 11 is maintained, and correspondingly, holes are injected from the p-type collector layer 21 into the n-type base layer 11. Further, the gate voltage $V_{CG}$ applied to the second gate electrode 50 is a negative voltage, and induces a p-type accumulation layer at the interfaces between the n-type base layer 11 and the gate insulating film 51, between the n-type barrier layer 25 and the gate insulating film 51, and between the p-type base layer 13 and the gate insulating film 51. Thereby, the hole ejection path is formed from the n-type base layer 11 and the n-type barrier layer 25 to the p-type contact layer 17. Thus, the holes are ejected from the n-type base layer 11 and the n-type barrier layer 25 to the emitter electrode 20, and the carrier amount in the n-type base layer 11 and the n-type barrier layer 25 is further reduced.

As a result, the collector current $I_C$ flows under the increased on-resistance by the reduced carrier amount in the n-type base layer 11 and the n-type barrier layer 25. Thus, the emitter-collector voltage $V_{CE}$ increases, and the power consumption $V_{CE}*I_C$ increases slightly.

In the period C shown in FIG. 8, the first gate electrode 40 is further turned off. For example, when the gate voltage VMS is decreased in order to turn off the first gate electrode 40, the potential of the first gate electrode 20 is not immediately lowered to the off potential. For example, while discharging the parasitic capacitor of the first gate electrode 40, the collector current $I_C$ is maintained to be substantially constant.

Subsequently, when the potential of the first gate electrode 40 starts to be reduced, the n-type channel gradually disappears at the interface between the p-type base layer 13 and the gate insulating film 41. Then, the collector current $I_C$ starts to decrease; and the emitter-collector voltage $V_{CE}$ starts to rise. The emitter-collector voltage $V_{CE}$, for example, once overshoots, and then, becomes the constant off-voltage.

During this period, the carriers in the n-type base layer 11 and the n-type barrier layer 25 are ejected to the emitter electrode 20 and the collector electrode 30, and the n-type base layer 11 and the n-type barrier layer 25 are depleted.

As shown in FIG. 9C, the holes in the n-type base layer 11 and the n-type barrier layer 25 are ejected to the emitter electrode 20. At this time, as the negative voltage is applied to the second gate electrode 50 (for example, $V_{CG}$=−15V), the p-type accumulation layer is induced at the interfaces between the n-type base layer 11 and the gate insulating film 51, and between the n-type barrier layer 25 and the gate insulating film 51. Thus, the holes in the n-type base layer 11 and the n-type barrier layer 25 are quickly ejected to the emitter electrode 20 through the p-type accumulation layer and the p-type base layer 13.

Further, a negative voltage is applied to the first gate electrode 40 (for example, $V_{MG}$=−15V) to induce a p-type accumulation layer at the interfaces between the n-type base layer 11 and the gate insulating film 41, and between the n-type barrier layer 25 and the gate insulating film 41. Thereby, the hole ejection is enhanced from the n-type base layer 11 and the n-type barrier layer 25 to the emitter electrode 20 through the p-type accumulation layer.

Further, in the period D shown in FIG. 8, the collector current $I_C$ decreases to the zero level, and the semiconductor device 5 is turned off at time $t_5$.

In the embodiment, the carrier ejection from the n-type base layer 11 and the n-type barrier layer 25 can be enhanced by providing the second gate electrode 50 and the third gate electrode 60, and the turn-off period C can be shortened.

Moreover, before applying the off voltage (for example, $V_{MG}$=−15V) to the first gate electrode 40 at time $t_4$, the second gate electrode 50 and the third gate electrode 60 are turned off at time $t_3$. Thereby, it is possible in the period B to start the turn-off period C after the carriers are reduced beforehand in the n-type base layer 11 and the n-type barrier layer 25. As a result, the turn-off period C can be further shortened.

For example, the variation of the emitter-collector voltage $V_{CE}$ indicated by a broken line in FIG. 8 exhibits the characteristics without the second gate electrode 50 and the third gate electrode 60. It is found that the turn-off period can be shortened by providing the second gate electrode 50 and the third gate electrode 60 as compared with the temporal change indicated by the solid line that shows the characteristics of the emitter-collector voltage $V_{CE}$ according to the embodiment.

The power consumption $V_{CE}*I_C$ in the turn-off period C depends on the length thereof, and the switching loss can be reduced by shortening the turn-off period C. In the semiconductor device 5 according to the embodiment, the on-resistance and the switching loss can be reduced by appropriately controlling the second gate electrode 50 and the third gate electrode 60.

For example, in the semiconductor device 5, the power consumption $V_{CE}*I_C$ is slightly increased in the period B by reducing the carrier amount in the n-type base layer 11 and the n-type barrier layer 25. However, the power consumption $V_{CE}*I_C$ is reduced more effectively by the shortening of the turn-off period C, and the switching loss can be reduced as a whole.

Moreover, by applying a negative voltage to the third gate electrode 60 (for example, $V_{PG}$=-15V), the hole ejection from the n-type base layer 11 and the n-type barrier layer 25 can be further enhanced. However, such control causes a significant decrease of the carrier amount in the n-type base layer 11 and the n-type barrier layer 25 in the period B, for example, and increases the power consumption $V_{CE}*I_C$, resulting in the increase of the switching loss. Thus, by appropriately arranging and controlling the second gate electrode 50 and the third gate electrode 60 according to this embodiment, it is possible to reduce the on-resistance and the switching loss of the semiconductor device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a semiconductor part provided with first and second surfaces, the second surface being positioned on a side opposite to the first surface;
   a first electrode provided on the first surface;
   a second electrode provided on the second surface;
   first to third control electrodes each provided at the second surface side of the semiconductor part with a trench gate structure; and
   first to third control pads electrically connected to the first to third control electrodes, respectively, the first control pad being electrically connected to at least a first control electrode, the second control pad being electrically connected to at least a second control electrode, the third control pad being electrically connected to at least a third control electrode, the first to third control pads being electrically isolated from each other so that, while a prescribed voltage is applied between the first and second electrodes,
   a first on-voltage and a first off-voltage are applied between the first control pad and the second electrode, the first on-voltage being applied until the first off-voltage being applied, the first on-voltage being higher than a threshold voltage of the first control electrode, the first off-voltage being lower than the threshold voltage of the first control electrode,
   a second on-voltage and a second off-voltage are applied between the second control pad and the second electrode, the second on-voltage being applied until the second off-voltage being applied, the second off-voltage being applied before the first off-voltage being applied between the first control pad and the second electrode, the second on-voltage being higher than a threshold voltage of the second control electrode, the second off-voltage being lower than the threshold voltage of the second control electrode, and
   a third on-voltage and a third off-voltage are applied between the third control pad and the second electrode, the third on-voltage being applied until the third off-voltage being applied, the third off-voltage being applied before the first off-voltage being applied between the first control pad and the second electrode, the third on-voltage being higher than a threshold voltage of the third control electrode, the third off-voltage being lower than the threshold voltage of the third control electrode and higher than the second off-voltage.

2. The device according to claim 1, wherein
   the first control electrode, the second control electrode, and the third control electrode are arranged along the second surface of the semiconductor part, and
   the third control electrode being provided between the first control electrode and the second control electrode.

3. The device according to claim 2, wherein,
   the semiconductor part includes a first portion and a second portion, the first portion of the semiconductor part being provided between the first control electrode and the third control electrode, the second portion of the semiconductor part being provided between the second control electrode and the third control electrode, and
   the first and second portions of the semiconductor part each having a width in a first direction directed from the first control electrode toward the second control electrode, the width of the first and second portions being greater than 0.1 micrometers.

4. The device according to claim 2, wherein
   the first to third control electrodes are provided between the first electrodes and the second electrodes, and
   the semiconductor part includes an n-type base layer, a p-type base layer, and an n-type emitter layer,
   the n-type base layer being provided between the first electrode and the second electrode, the n-type base layer being provided with a thickness in a second direction directed from the first electrode to the second electrode so that a prescribed breakdown voltage is provided between the first and second electrodes, the thickness of the n-type base layer being in a range of 1 to 1000 micrometers,
   the p-type base layer being provided between the n-type base layer and the second electrode, the p-type base layer being provided respectively between the first control electrode and the third electrode and between the second control electrode and the third control electrode, the p-type base layer being provided with a thickness in the second direction of 0.1 to several micrometers and including a p-type impurity with a concentration in a range of $1\times10^{12}$ to $1\times10^{14}$ cm$^{-2}$,
   the n-type emitter layer being provided between the p-type base layer and the second electrode, the n-type emitter layer being provided with a thickness in the second direction of 0.1 to several micrometers and including a n-type impurity with a concentration in a range of $1\times10^{14}$ to $1\times10^{16}$ cm$^{-2}$.

5. The device according to claim 4, wherein
the semiconductor part further includes a p-type collector layer and a n-type buffer layer, the p-type collector layer being provided between the first electrode and the n-type base layer, the n-type buffer layer being provided between the n-type base layer and the p-type collector layer;

the p-type buffer layer includes an n-type impurity distributed in the second direction with a second peak concentration positioned at a second depth from the first surface of the semiconductor part, the first depth being shallower than the second depth.

6. The device according to claim 1, wherein the second electrode is electrically connected to a fixed potential; the first and second off-voltages are −1.5 V with respect to the fixed potential; and the third off-voltage are 0 V with respect to the fixed potential.

7. The device according to claim 1, wherein multiple first control electrodes, multiple second control electrodes and multiple third electrodes are provided at the second surface side of the semiconductor part, and
a number of the multiple first electrodes is greater than a number of the multiple second control electrodes and greater than a number of multiple third control electrodes.

* * * * *